United States Patent [19]
Keane et al.

[11] Patent Number: 5,488,331
[45] Date of Patent: Jan. 30, 1996

[54] ACTIVE BIAS FOR A PULSED POWER AMPLIFIER

[75] Inventors: Anthony R. A. Keane, Webster; Bart C. Vandebroek, Penfield, both of N.Y.

[73] Assignee: ENI, A Div. of Astec America, Inc., Rochester, N.Y.

[21] Appl. No.: 418,182

[22] Filed: Apr. 7, 1995

Related U.S. Application Data

[63] Continuation of Ser. No. 243,161, May 16, 1994.
[51] Int. Cl.$^6$ ................................................. H03G 3/30
[52] U.S. Cl. ........................................... 330/296; 330/285
[58] Field of Search ....................... 330/124 R, 127, 330/129, 285, 295, 296

[56] References Cited

U.S. PATENT DOCUMENTS 4,794,343  12/1988  Yang ..................................... 330/129 X
5,101,173  3/1992  DiPiazza et al. ................... 330/279 X

*Primary Examiner*—Steven Mottola
*Attorney, Agent, or Firm*—Harris Beach & Wilcox

[57] ABSTRACT

A high-power radio-frequency amplifier acts on periodic pulses of RF energy. The bias is controlled for each of a bank of FETs or other amplifier devices that constitutes the main power stage. A sample of bias current is obtained during a blanking period on the front porch of the RF gating period. Quiescent drain current is measured, and stored on a sample/hold circuit. A digital signal processor provides bias values that are sent via a D/A converter to biasing circuits that add the bias levels to the input RF signal. If the bias current is above or below a desired level, the stored bias level is decreased or incremented respectively. A timing control circuit gates the sample/hold circuit and switches in advance of the biasing circuits. The timing control circuit also creates a blanking signal to apply to an attenuator to produce a null region during the first 100 microseconds of the gating signal. A thermal sensor is coupled to one or more amplifying devices for presetting the operating voltage when operation has been interrupted for a predetermined period of time.

1 Claim, 3 Drawing Sheets

ACTIVE BIAS FOR A PULSED POWER AMPLIFIER

This is a continuation of application Ser. No. 08/243,161 filed May 16, 1994.

BACKGROUND OF THE INVENTION

This present invention relates to power amplifiers and is more particularly directed to pulsed RF power amplifiers of the type in which several FET's or other amplifying devices are ganged together to amplify an RF input signal. The invention is more specifically directed to a technique of controlling the bias levels of the amplifying device so that they are kept at a desired operating point in their active regions.

Transistors or other amplifying device have an active region in which there is a linear relationship between gate or grid voltage and drain or plate current. For example, in a linear Class A amplifier, a bias level is selected so that when a null signal is applied to the grid, gate or other control electrode, the output current is at a desired quiescent level in about the center of the linear part of the devices active region. Because operating characteristics such as threshold voltage, transconductance etc. of the amplifying device will change, due to aging, temperature drift, or other reasons, bias control techniques have been used to maintain a reasonably constant bias current in the transistors or other device used in the gain stages of an RF power amplifier. One proposed bias control technique for an RF amplifier is described in Erb et al. U.S. Pat. No. 4,924,191.

Low-power amplifiers can include a source degeneration resistor in series with the source-drain path, and a simple biasing network on the gate to provide a stable bias current. However, high-power devices tend to have much smaller gains than low-power devices, and this requires an increased size and operating cost for network gain control techniques for high-power devices. Resistors in the source-drain path affect gain and create an output power loss, even if bypassed by a capacitor for high frequencies. This is unacceptable in high power amplifiers where any power loss will result in the need for additional power stages or an increased number of paralleled devices.

If the high-power amplifier is operated continuously, it can employ a technique that measures drain current and adjusts the gate voltage so as to keep constant the dc component of the drain current.

However, for many applications it is necessary for the amplifier to be designed for pulsed operation. In that case a static feedback network is not feasible to maintain a constant bias. This results because there is no current output flowing when the amplifier is gated off, so no bias measurement can be taken between pulses.

A previously-proposed solution to this problem involves gating each amplifying device in turn while applying a null or zero input. The bias current for each device is measured, and the results of this measurement are supplied to a processor that controls the respective bias levels. This technique requires a test mode, in which the amplifying elements are forward biased and a null input signal is applied. However, there is no provision for creating a null region for each occurrence of a pulsed input signal. Also, if the amplifier is to be operated in a continuous mode, the technique requires that a forced idle condition be imposed in turn on the amplifying elements. Thus, the effect is that the amplifier will not operate in a continuous mode.

This technique also has drawbacks in that it interferes with its user because of its forced idle condition. Additionally the feedback correction in this technique is extremely slow, and cannot prevent failure from thermal runaway for many types of transistors that require continuous, real-time feedback.

The usual technique to control bias compensation is to employ a temperature compensation network. This only corrects for thermal drift of the FET gate-to-drain threshold voltages. This does have the advantage of operating whether the amplifier is used continuously or intermittently. However, because of its open-loop nature, this technique does suffer certain drawbacks. Each FET or other device requires adjustment to set the initial bias to the required level. This most often involves a potentiometer that is set by hand. Also, the thermal drift characteristic of each FET has to match, or an adjustment has to be made during manufacture to compensate for variance in thermal drift.

Recently some circuit designers have begun to consider high power FETs for use in power amplifiers as a means to reduce cost and size of the amplifier. These FETs, which are more frequently employed in switching power supplies, have a much more abrupt gate-voltage-to-drain-current characteristic than an RF power FET. This makes a simple thermal compensation scheme difficult and costly to implement. These low-cost FETs are also very sensitive to thermal variations, which can cause thermal runaway. If this sensitivity is not addressed adequately, destruction of the device can result. That is, threshold voltage change because of temperature change is a serious problem. The fact that the gate voltage to drain current characteristic is steeper and more abrupt as compared with other transistors results in a faster and more extreme thermal runaway.

OBJECTS AND SUMMARY OF THE INVENTION

It is an object of this invention to provide a reliable but low cost RF amplifier which avoids the drawbacks of the prior art.

It is an important object to provide a bias-control circuit that provides active, real-time, closed loop control of bias current.

It is an object also to provide an amplifier bias control circuit that is operative when the amplifier operates in a pulsed mode.

It is a further object to provide an amplifier control circuit that does not interfere with the operation of the amplifier by the user.

According to one aspect of this invention, the bias control circuit employs for each associated amplifying device a bias current sampling circuit that measures the output current of its associated amplifying device and produces an output level that represents the output current of the device, and a sample/hold circuit that samples the output level of the sampling at a time when a zero or null input level appears at the control electrode of the amplifying device. This circuit then applies a resulting output current bias signal to an input of a digital control circuit. The digital control circuit receives the output current bias signals from all of the amplifying devices, and computes for each amplifying device an input bias level that is based on the levels of the respective output current bias signals. There are also input bias circuits associated with the respective amplifying devices. Each of these includes an adder circuit with one input receiving the input bias level as adjusted by the digital control circuit and another input to which the RF input signal is applied so that the amplifying device is properly biased to function in the linear part or more generally of a certain operating point. Each of these circuits has an associated latch terminal that is gated to supply the input bias level. A timing circuit provides appropriate timing pulses to the gate terminals of several bias current sample/hold circuits, the digital control circuit, and the latch circuits. The timing circuit also provides a blanking signal to an attenuation circuit that creates a null input region for each of the RF input pulses, preferably at a leading edge or front porch thereof. This null region could also occur at a trailing edge, or back porch, of the RF pulse.

In a preferred embodiment, there is a thermal sensor mounted in contact with each of the amplifying devices, or with each group of devices. This provides a temperature level signal to the digital control which can be used to make quick or coarse bias adjustments when the amplifying devices have been off for sufficient time for them to cool. The temperature characteristic of each device can be learned during normal operation. The bias-level-to-temperature characteristic is stored and can be continuously adjusted for each amplifying device. This adjustment is optional.

The process of controlling the operating level of the several amplifying devices comprises applying a gating pulse as an input signal, attenuating a portion of each RF pulse during a predetermined period to create a null region, sampling the output current of each of the amplifying devices during each null period, applying respective bias current levels, based on the sampled output currents, to a control circuit that compares each bias current level with a respective stored value and computes respective bias input levels, and applying the bias input levels to respective bias input means for the several amplifying devices, so that the output current during the null regions for each of the amplifying devices is maintained at a predetermined level.

The sampled output current levels can be offset-adjusted. This involves sampling the output currents of the amplifying devices in the region between pulses, and combining (i.e., subtracting) the resulting sampled output currents with the sampled currents taken during the null period to produce respective offset-adjusted bias current levels. The temperature sensors are used to set the initial bias input level or start point. Upon initial turn on, or at times where the amplifier has not received an input pulse for some time period (1 second or more), there is no reliable drain current measurement on which to base the bias input level for the next pulse. Therefore, at these times, the temperature sensors come into play. For each amplifying device there is a stored table of values on input level required to reach a predetermined bias current level, versus heat sink temperature. The heat sink temperature is directly related to the internal temperature of the device when no RF or gating pulse has been applied for some minimum time (e.g. one second or more). The stored table can cover a range of temperatures. Thus, when there has been no gating pulse for at least one second this table of input level versus heat sink temperature is employed. Then, after the first pulse, the biasing scheme described above takes over.

Temperature sensors can be used for sensing the operating temperature of each of the amplifying devices and providing respective temperature signals to the control circuit. The control circuit automatically adjusts the bias input levels for swings in operating temperatures.

The above and many other objects, features, and advantages of this invention will become apparent from the ensuing description of a preferred embodiment, which is to be read in conjunction with the accompanying Drawing.

DETAILED DESCRIPTION OF THE PREFERRED EMBODIMENT

Figure 1:
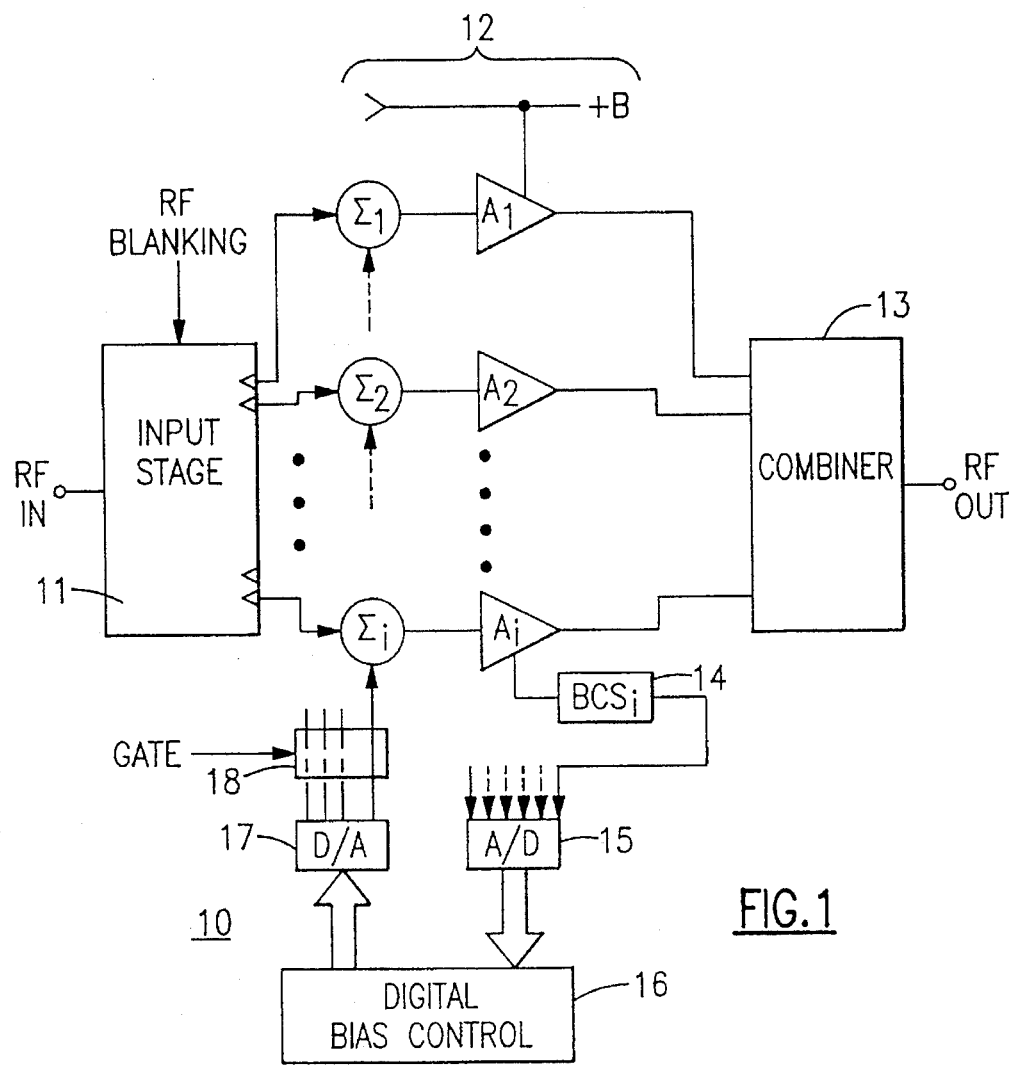
FIG. 1 is a simplified schematic view of an RF amplifier with a digital bias control according to one preferred embodiment of the present invention.

With reference now to the Drawing, FIG. 1 shows schematically a high power RF amplifier 10, which has a bias arrangement that incorporates virtual active, real-time, closed loop control of bias current, that does not interfere with operation of the amplifier.

The amplifier 10 has an input stage 11, shown here in rather simplified form. In practice this stage 11 would comprise a number of input amplifiers and power splitters. The RF input signal which is received at an input terminal RF IN is split and fed to a number of amplifying devices $A_1$, $A_2 \ldots A_i$ each of which has an associated adder $\Sigma_1$, $\Sigma_2 \ldots \Sigma_i$ in advance of it to combine a dc bias level with the bipolar RF signal. In a preferred mode the final amplifying devices $A_1, A_2 \ldots A_i$ are operated in class AB. The bias level is selected for each device to operate in a linear portion of its active region. The first amplifying stages are preferably operated in class A, while the final two stages are operated in class AB. Following the power amplifier 12 is a combiner 13, here shown in simplified block form, which combines the output currents of the several amplifying devices and provides an amplified RF current at an output terminal RF OUT.

The closed-loop bias control feature is shown on the lower part of FIG. 1. For each amplifying device, a bias current sampling circuit 14 obtains a sample of the output current, e.g. drain current, at a time when no signal is applied. Respective sampling circuits 14 are coupled to the outputs of each of the amplifying devices $A_1$ to $A_i$, but for the sake of simplicity, only the ith bias current sampling device 14 is illustrated. The sampled bias current levels from these circuits 14 are converted to digital form in an A/D converter 15, and digital representations of the first to ith bias current samples are applied to an input of a digital bias control circuit 16. In the latter circuit, the digitized bias current values are compared with stored known values, and corrections to the bias input level are made iteratively based on the sampled current measurement and the desired predetermined level. The corrected bias voltage levels are provided for each of the amplifying devices in the power stage 12. In a preferred mode, an algorithm is employed wherein the amount of correction depends on the size of the measured deviation and the desired level. However, many other algorithms could be employed. The digital values that result from this computation are output to a D/A converter 17 and respective bias voltages are fed to a latch or gate circuit 18. The gate circuit has respective outputs coupled to bias inputs of the adders $\Sigma_1, \Sigma_2 \ldots \Sigma_i$ where, as mentioned just above, the bias voltages are combined with the input RF signal. In practice, where the RF signal is provided as a pulsed signal, a blank or null portion is created at the onset of each pulse (for a width of about a 100 μsec). The amplifying devices are gated on at the onset of the pulse, and the bias output current is measured during the null portion of the RF pulse. The digital bias control circuit 16 computes corrected bias levels between occurrences of the RF pulse, and the new bias level is ready to be applied for the next gating pulse in succession, or for the next series of pulses depending on the operating mode. The bias is corrected for each of the amplifying devices $A_1$ to $A_i$ consecutively.

Figure 2:
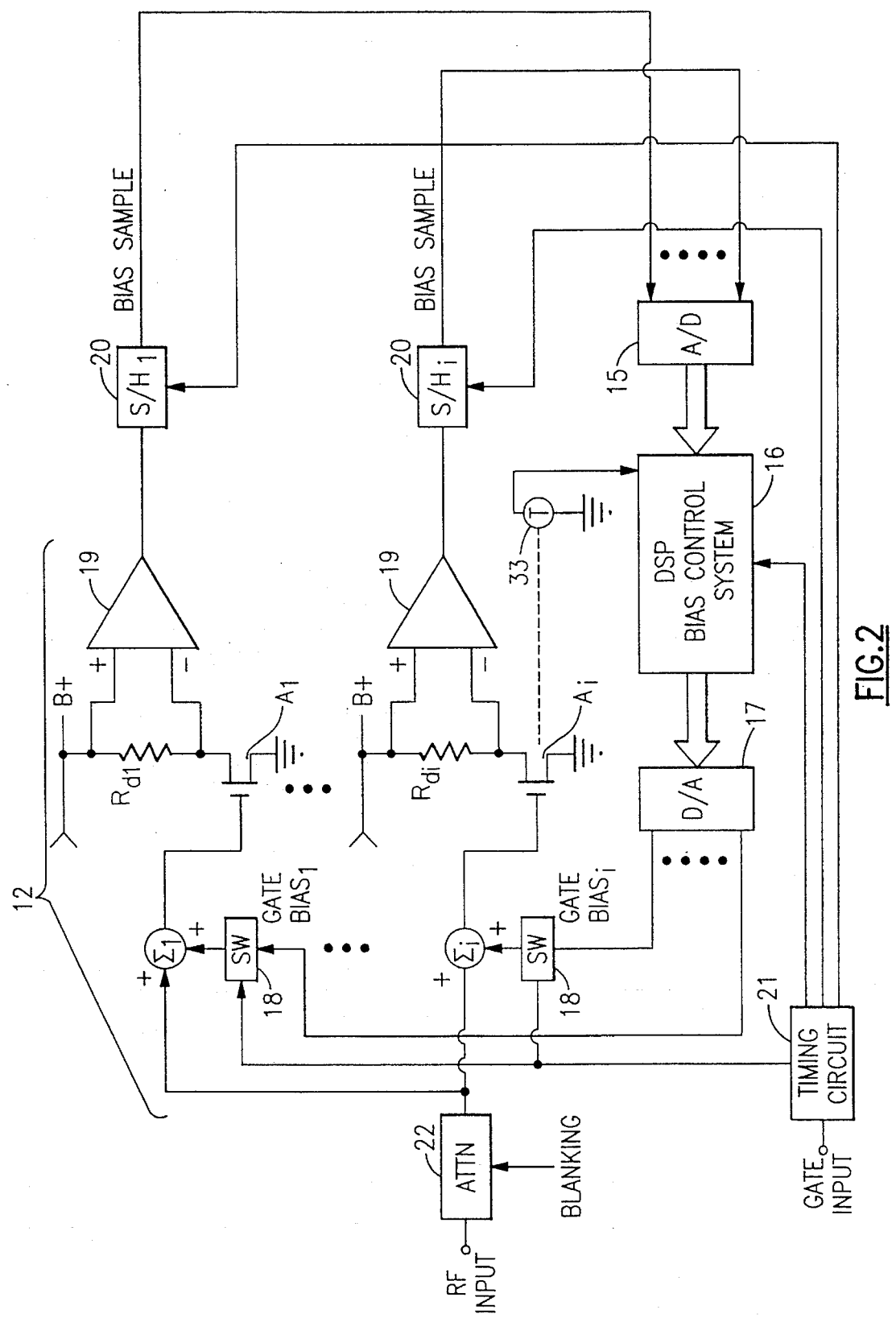
FIG. 2 is a more detailed schematic view of the digital bias control circuit of this embodiment.

More details of the amplifier 10 are shown in FIG. 2. As seen in this view each of the amplifying devices $A_1$ to $A_i$ is a power FET whose gate receives an input signal from adders $\Sigma_1$ to $\Sigma_i$, end each has its drain electrode coupled through a small-value drain resistor $R_{d1}$ to $R_{di}$ to a supply voltage B+. In other embodiments, the amplifying devices can be any active amplifying element. A measuring amplifier 19 has inputs connected across the respective drain resistor $R_{d1} \ldots R_{di}$ and has an output supplying an analog voltage level to a respective sample/hold circuit 20. The voltage across the drain resistor corresponds to the drain current based on the resistor value. Here the drain resistor can be 0.1 ohms, so that it is as small as possible to avoid gain loss and power loss, but sufficient to provide a measurement with an acceptable signal-to-noise ratio. The sample/hold circuits 20 provide respective bias sample signals to the A/D converter 15. The bias control circuit 16 recomputes bias levels and supplies data to the D/A converter 17 which provides the respective bias levels as signals GATE BIAS1 to GATE BIASi, which are fed to the gate circuit 18, here represented as respective latching switches each associated with a particular one of the several adder circuits $\Sigma 1$ to $\Sigma i$.

A timing circuit 21 receives a gate input signal at the commencement of each gate period in which the FETs are active, and provides gating signals to the sample/hold circuits 20 at appropriate times, and also provides timing signals to the bias control circuit 16 and switching signals to the gate circuit 18. An attenuator circuit 22 is shown here in advance of the power stage 12, and a blanking signal BLANKING is applied to this circuit 22 to create a null region for measuring the bias currents.

Operation of the bias control circuit of this invention can be explained with reference to FIGS. 3A to 3C.

Figure 3A:
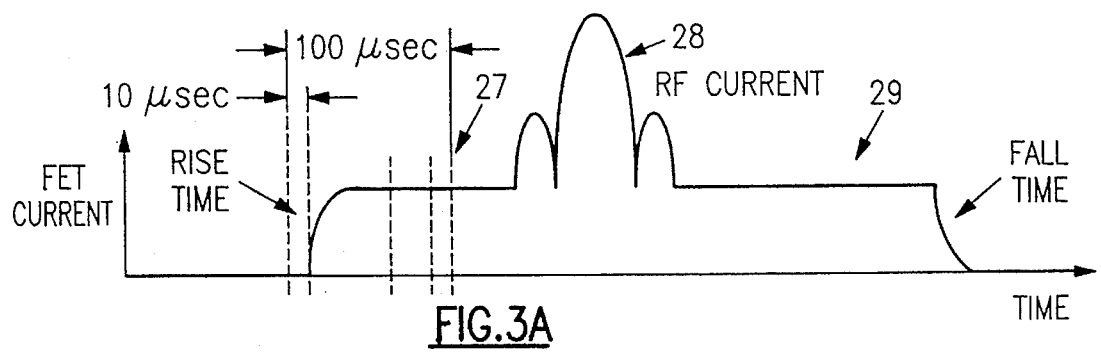
FIGS. 3A, 3B, 3C, 3D, 3E and 3F are charts showing the timing of various signals which appear in this embodiment.
Figure 3B:
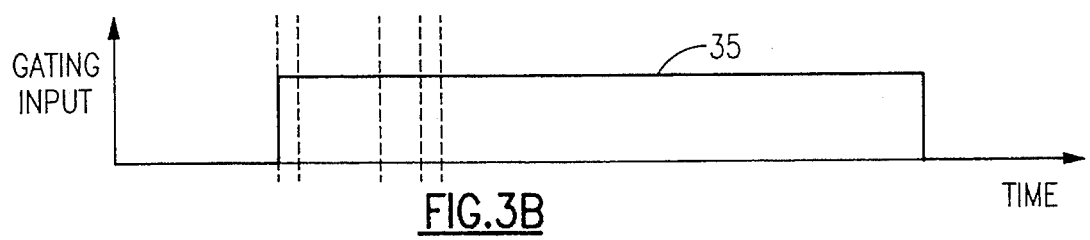
Figure 3C:
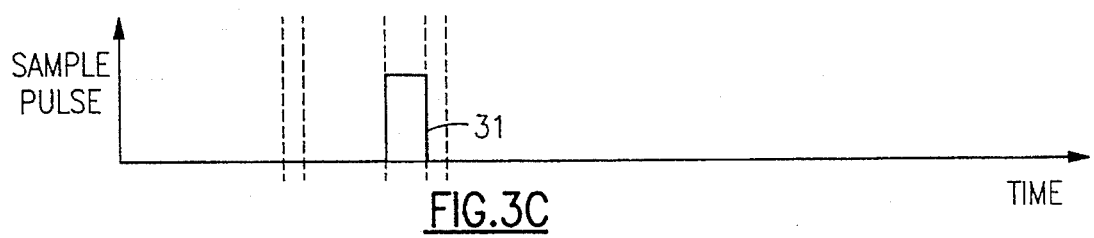

As shown in FIGS. 3A and 3B, at the commencement of a pulse of input RF energy, power is applied to the FET, and FET drain current appears generally as shown. The input RF signal is blanked at the onset of the pulse when a blanking signal 34 occurs (FIG. 3F) to create a front porch 27, here of about 100 microseconds duration.

After this, the blanking is removed and the current that flows through the FET in a signal portion 28 represents both RF current and bias current. Optionally, a null region or back porch 29 can be created on the trailing end of the pulse. The timing circuit sends a gate signal 30, as shown in FIG. 3E, to the latch circuits 18, so that bias voltage is provided only during the pulse period as shown. The timing circuit 21 provides a sample pulse 31 (FIG. 3C) to each of the sample/hold circuits 20 to capture the level of the bias current, i.e., the drain current that flows during the front porch portion 27 where there is a null RF input but where a predetermined bias voltages are applied to the amplifying devices. The bias samples captured by the circuits 20 are digitized in the converters and furnished to the bias control circuit 16, and the bias levels are recomputed to keep each of the amplifying devices $A_1$ to $A_i$ at a predetermined point in its operating region. There is an internal gating delay of about 5 to 10 microseconds as compared to the externally applied gating signal 35 (FIG. 3B). This brief interval less than 100 μsec is used to freeze the offset sample before the devices start conducting offset. This offset will be fresh and as close to bias current measurement as possible.

Figure 4:
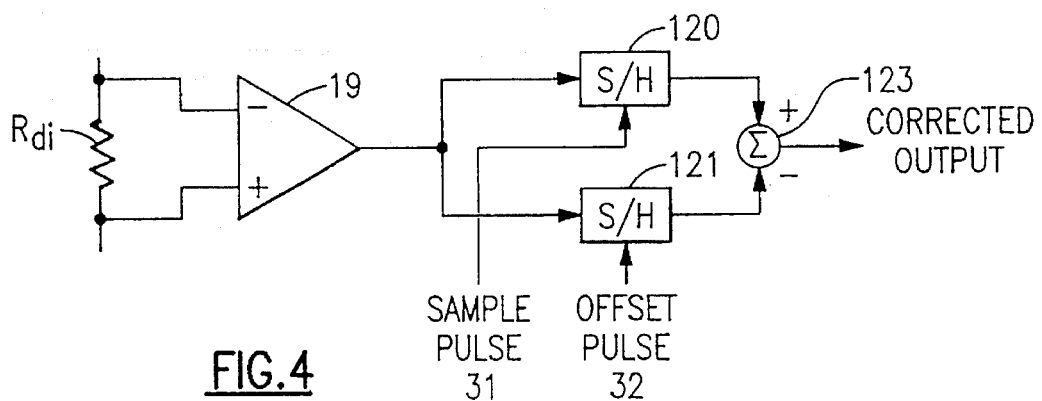
FIG. 4 is a schematic block diagram of an offset compensation feature of a preferred embodiment.
Figure 3D:
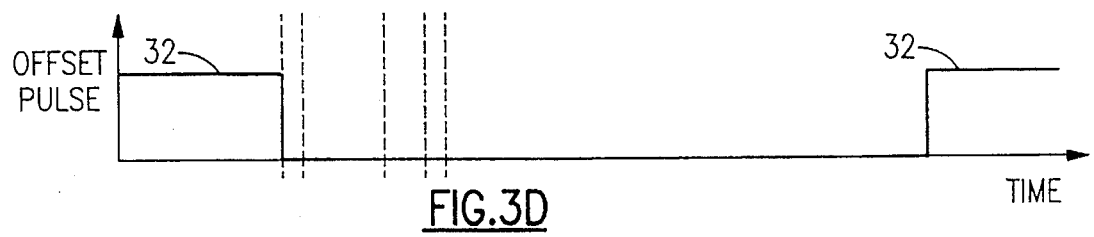
Figure 3E:
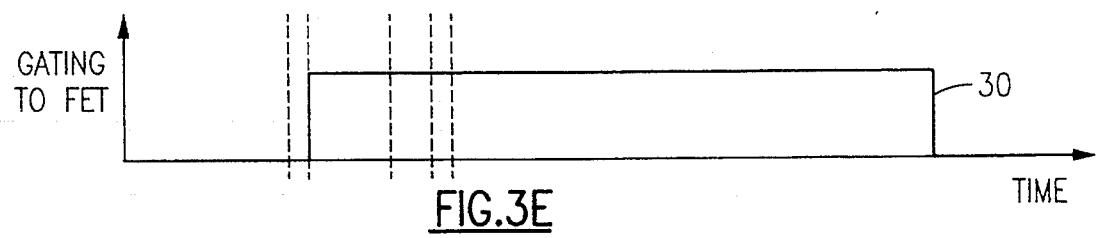
Figure 3F:
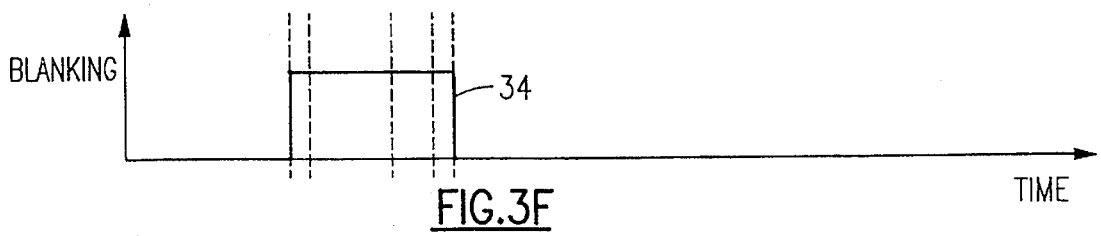

An offset pulse 32 as shown in FIG. 3D can be generated during a time when no bias is applied to the amplifying device, i.e., either before the leading edge or after the trailing edge of the gating pulse. This offset pulse is supplied to an offset-correcting sample/hold system as shown in FIG. 4. The offset pulse includes the 5–10 microsecond interval mentioned above.

In the embodiments which employ offset correcting sampling, a bias current sample/hold circuit 120 has an input coupled to the respective bias current measuring amplifier 19, and an associated offset current sample/hold circuit 121 has its input also connected to the amplifier 19. The sample pulse 31 gates the sample hold circuit 120 and the offset pulse 32 gates the other sample/hold circuit 121 at the times shown in FIGS. 3C and 3D, respectively. An adder circuit 123 has a non-inverting input coupled to the sample/hold circuit 120 and has an inverting input coupled to the sample/hold circuit 121. The adder provides an offset-corrected output bias signal that is applied to the converter 15. This cancels the offset portion of the output bias current. This is done because drain current measurement for the FET or other device is carried out a high voltage. The offset measurement corrects for the common mode signal on the opdmp.

Returning to FIG. 3, the problem of first-pulse bias compensation is solved by employing a thermal sensing device 33. The thermal device is in thermal communication with one or more of the amplifying devices $A_1, A_2 \ldots A_i$ and sends a temperature output signal to the bias control circuit 16. When the amplifier 10 is initially turned on, or has been gated off for a significant period of time so that the associated amplifying device $A_i$ has cooled, the thermal sensing device 33 will report this to the bias control circuit 16. The thermal characteristics of each of the amplifying devices can be quite different and can change as the device ages, but this information is stored in memory in the bias control circuit and is updated during operation if required. The bias correction for each thermal increment (e.g., for about each one degree celsius) is stored in non-volatile memory. When the amplifier has been gated off for a significant period (e.g. one second or longer) the stored values based on temperature are used to generate the respective bias levels. Then once amplifier operation is underway, the active bias feedback loop takes over to maintain the amplifier bias at the desired level.

Because the non-volatile memory is refreshed during the active gating cycles, this biasing technique automatically accounts for aging of the FET.

Typically, the heat sensors or thermal sensing devices are mounted on heat sinks for the FETs or other amplifying devices $A_1, A_2 \ldots A_i$. Because a single heat sink may be common to a pair of amplifying devices, each thermal sensor can track the operating temperature of a group of a amplifying devices.

On the other hand, the active bias control system is primarily designed to compensate for small, long-term drifts in bias current. The active system reacts at an incremental rate to track the slow, long-term changes. This means that the digital bias control circuit 16 employs an algorithm that varies the bias level by a small increment on each iteration. As such, this provides protection against transient fluctuations, as a large, momentary current flux will produce only one increment increase in bias voltage. This protection guards against excessive bias voltage being applied to the FET gate.

While this invention has been described in detail with reference to a preferred embodiment, it should be recognized that the invention is not limited to that embodiment. Rather, many variations will be apparent to those of skill in the art without departure from the scope and spirit of this invention, as defined in the appended claims.

What is claimed is:

1. A bias control circuit for adjusting an input bias voltage for each of a plurality of amplifying devices comprising:

a digital control circuit for converting a plurality of analog output current bias signals into a plurality of equivalent digital output current bias signals, for generating a plurality of digital input bias levels for each one of the amplifying devices based on the associated digital output current bias signal from each of the amplifying devices, and for converting the digital input bias levels into a plurality of equivalent analog input bias levels;

a plurality of bias current sample means, each one of said bias current sample means being associated with one of the amplifying devices for periodically gating the analog output current bias signal to said digital control circuit;

a plurality of input bias means, each one of said bias means being associated with one of the amplifying devices for periodically biasing an input with the associated analog input bias level generated by said digital control circuit, whereby the amplifying devices are maintained at a desired operating point; and a timing circuit means for periodically gating said digital control circuit, said plurality of bias current sample means, and said plurality of input bias means.

* * * * *